US006171886B1

(12) United States Patent
Ghosh et al.

(10) Patent No.: US 6,171,886 B1
(45) Date of Patent: Jan. 9, 2001

(54) METHOD OF MAKING INTEGRATED HYBRID SILICON-BASED MICRO-ACTUATOR DEVICES

(75) Inventors: Syamal K. Ghosh, Rochester; Edward P. Furlani, Lancaster; Dilip K. Chatterjee, Rochester, all of NY (US)

(73) Assignee: Eastman Kodak Company, Rochester, NY (US)

(*) Notice: Under 35 U.S.C. 154(b), the term of this patent shall be extended for 0 days.

(21) Appl. No.: 09/109,124

(22) Filed: Jun. 30, 1998

(51) Int. Cl.$^7$ .................................................. H01L 27/14
(52) U.S. Cl. ...................... 438/73; 438/3; 438/98; 438/54; 438/55; 438/64
(58) Field of Search .................................. 438/3, 48, 49, 438/50, 51, 52, 53, 54, 55, 56, 57, 58, 59, 60, 61, 62, 63, 64, 73; 333/262

(56) References Cited

U.S. PATENT DOCUMENTS

| | | | |
|---|---|---|---|
| 4,224,594 | * 9/1980 | Anthony et al. | 338/32 R |
| 4,827,218 | * 5/1989 | Meunier et al. | 324/252 |
| 5,644,177 | * 7/1997 | Guckel et al. | 310/40 |
| 5,658,810 | * 8/1997 | Dydyk et al. | 438/49 |
| 5,711,912 | * 1/1998 | Chattergee et al. | 264/428 |
| 5,724,015 | * 3/1998 | Tai et al. | 335/78 |
| 5,821,841 | * 10/1998 | Furlani et al. | 335/229 |
| 5,982,169 | * 11/1999 | Furlani et al. | 324/174 |

OTHER PUBLICATIONS

"Advances in Actuators", edited by A. P. Dorey, Lancaster University, UK and J. H. Moore, Lucas Bryce, Gloucester, UK, "Institute of Physics Publishing Bristorl and Philadelphia", "*Silicon Microactuators*", by Mehran Mehregany, pp. 135–178.*

* cited by examiner

*Primary Examiner*—Matthew Smith
*Assistant Examiner*—Victor Yevsikov
(74) *Attorney, Agent, or Firm*—Clyde E. Bailey, Sr.; Stephen H. Shaw

(57) ABSTRACT

A method of making micro-actuator devices including a silicon wafer, a magnet positioned inside an insulated actuating chamber having electrical coil wound around its circumference thereby forming an electromagnet assemblage. A plurality of etched holes in silicon wafer receives the electromagnet assemblage and is adapted to produce a magnetic field in response to an applied current that acts on the magnet to cause the axial reciprocating motion of the magnet.

17 Claims, 4 Drawing Sheets

METHOD OF MAKING INTEGRATED HYBRID SILICON-BASED MICRO-ACTUATOR DEVICES

FIELD OF THE INVENTION

This invention relates to fabrication of integrated hybrid silicon-based micro electromechanical devices. This invention specifically utilizes the conventional silicon planar technology to build integrated three-dimensional arrays of hybrid silicon-based micro-actuators.

BACKGROUND OF THE INVENTION

Micro-Electromechanical Systems (MEMS) is a rapidly growing field that is impacting many applications today. Three dimensional micro-engineered devices and systems involving silicon planar technology can be mass produced with features from one to a few hundred microns having tolerances in micron or sub-micron level. Most of the current micro-engineering technologies are evolved from the adaptation of thin films, photolithographic and etching technologies generally applied to silicon wafers on which silicon monoxide, silicon dioxide, silicon nitride and the like thin films are deposited and etched thereafter yielding planar configuration.

Although the planar silicon technology is capable of building a three dimensional array, the process steps involved in building those structures are many and very often exceed 20 to 30 steps thus making the process less attractive for many applications. Furthermore, there are many complicated structures that are not possible to be incorporated in the silicon planar technology because of certain limitations of the thin film technology.

Moreover, experience indicates that the current planar technologies using silicon substrates are inadequate for the fabrication of an integrated and self-contained three-dimensional arrays of micro-devices which can be used as solenoids, actuators, transformers and the like.

The limitation of the planar silicon technologies stems from the fact that the multi-step thin film technology along with etching processes which are usually used to build three dimensional structures on a silicon wafer can not produce complex structures. As for example, one of the greatest drawbacks of the silicon technology is that it is not possible to build a buried helical coil or a uniform vertical cylindrical column having higher length to radius aspect ratio, and similar complex configurations. Furthermore, building three-dimensional multi-layered structures using thin film technology involves multiple process steps, generally twenty or more, and therefore makes this process not economically feasible.

Therefore, there persists a need for a method to fabricate integrated hybrid silicon-based micro electromechanical devices, such as solenoids, actuators, and transformers, that requires substantially fewer steps thereby reducing production cycle time and increasing cost efficiency.

SUMMARY OF THE INVENTION

It is, therefore, an object of the present invention to provide a method of making integrated hybrid silicon-based micro-actuator devices which is cost effective and requires minimal production steps.

It is another object of the invention to provide a method of making integrated hybrid micro-actuator devices that uses silicon wafer technology in conjunction with micro-molding technology consisting of ceramic, magnetic and polymeric materials.

It is a feature of the invention that a method of fabricating integrated hybrid silicon-based micro-actuator devices comprises the step of arranging an actuator assemblage having a displaceable ferromagnetic member into a cavity of a silicon wafer, the ferromagnetic member being reciprocatingly axially displaced in an actuating chamber in response to an applied current to conductive pads on the silicon wafer.

Accordingly, for accomplishing these and other objects, features and advantages of the invention, there is provided, in one aspect of the invention, a method of fabricating hybrid micro-actuator comprising the step of providing a generally planar silicon wafer having at least one generally cylindrical, etched cavity therein and at least two electrical contacts arranged about the at least one cavity. A micro-molded ferromagnetic member is provided having a first and second ends and a non-magnetic actuator arm extending from any one of the first and second ends. Also provided is an electrically insulated actuating chamber for receiving the ferromagnetic member and for enabling reciprocating displacements of the ferromagnetic member therein. The actuating chamber has a first electrical coil wound partially lengthwise about a first half portion of the chamber and a second electrical coil wound lengthwise about a second half portion of the chamber. Each of the first and second coils having a pair of free end portions for electrically connecting to the electrical contacts of the silicon wafers. The ferromagnetic member is arranged for axial reciprocating displacement inside the actuating chamber with the actuator arm protruding outwardly from the actuating chamber. This arrangement forms an electromagnetic actuator assemblage. A closure member having an opening is securely applied to the open end of the actuating chamber containing the ferromagnetic member such that the actuator arm protrudes through the opening in the closure member. The electromagnetic actuator assemblage is then arranged securely into one cavity in the silicon wafer such that the pair of free end portions of the first and second coils surrounding the actuating chamber provides an electrically conductive path to corresponding electrical contacts arranged about the at least one cavity in the silicon wafer. Thus, current flow through the electrically conductive path causes reciprocating axial displacements of the ferromagnetic member inside the actuating chamber in response to the current flow thereby defining a micro-actuator.

It is, therefore, an advantage of the present invention that the disclosed method of fabrication surmounts the several problems associated with the planar silicon technology in that the buried coil structure, monolithic ceramic columnar structure and other complex three dimensional features can be integrated as a hybrid device. Moreover, the present invention offers a unique solution to the conventional silicon technology by integrating the micro-molded three-dimensional monolithic components within a silicon wafer. Further advantages of this invention include its cost-effectiveness associated with the manufacturing of three-dimensional arrays of micro-devices. Also, the method of the invention overcomes many of the disadvantages of planar silicon-based thin film technology. The method of the invention further enables the manufacture of micro-devices utilizing automated silicon technology for integrated electronics. Finally, the method of the invention enables the utilization of the cost-effective criteria of silicon technology in conjunction with micro-molding technologies.

BRIEF DESCRIPTION OF THE DRAWINGS

The above and other objects, features and advantages of the present invention will become more apparent when taken in conjunction with the following description and drawings wherein identical reference numerals have been used, where possible, to designate identical features that are common to the figures, and wherein:

DETAILED DESCRIPTION OF THE PREFERRED EMBODIMENT

Figure 1:
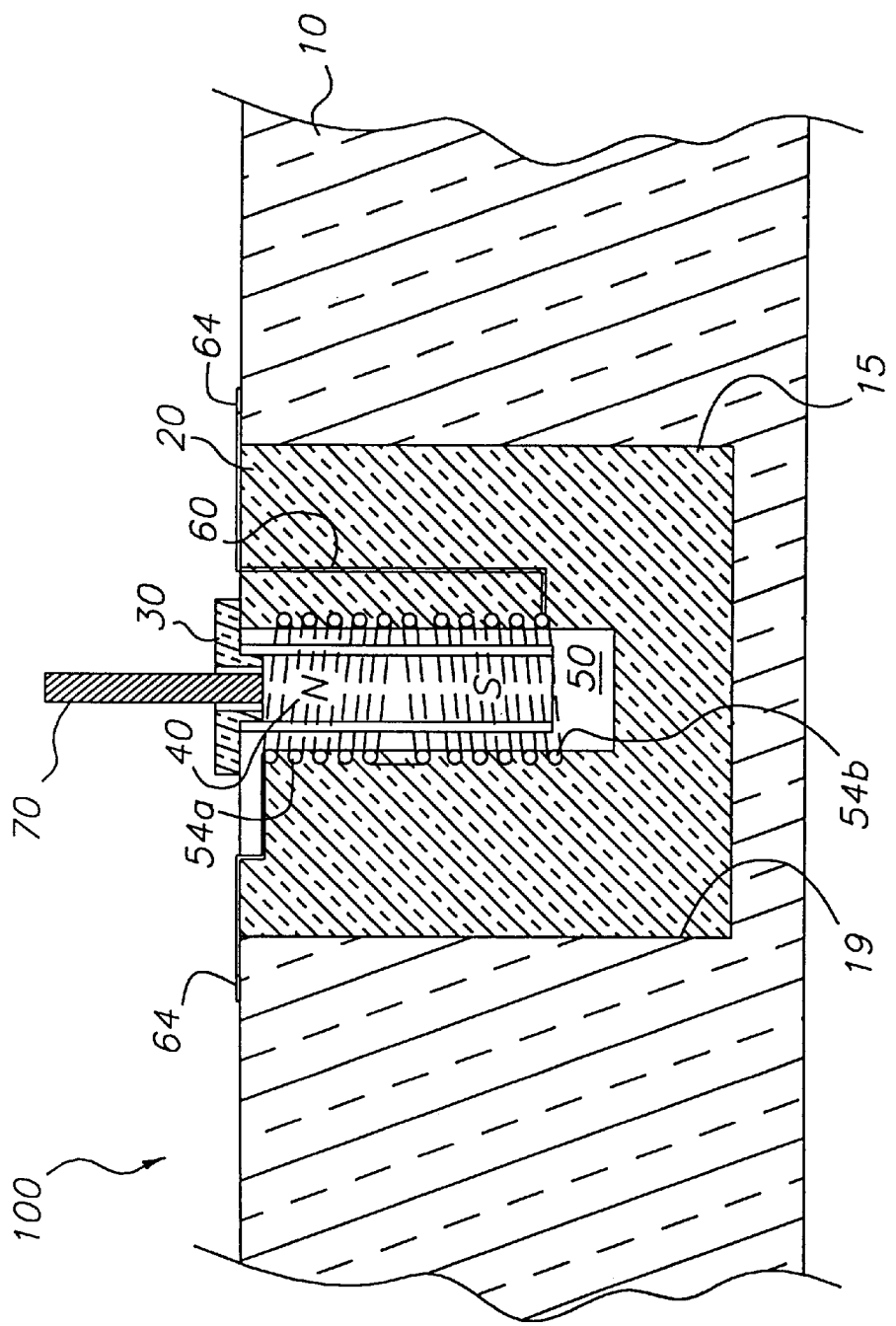
Figure 5:
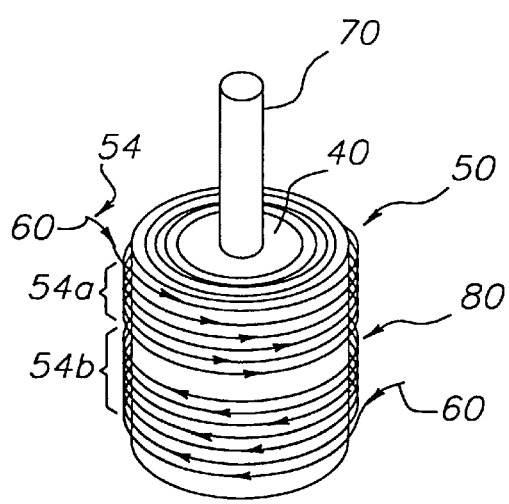
Figure 6:
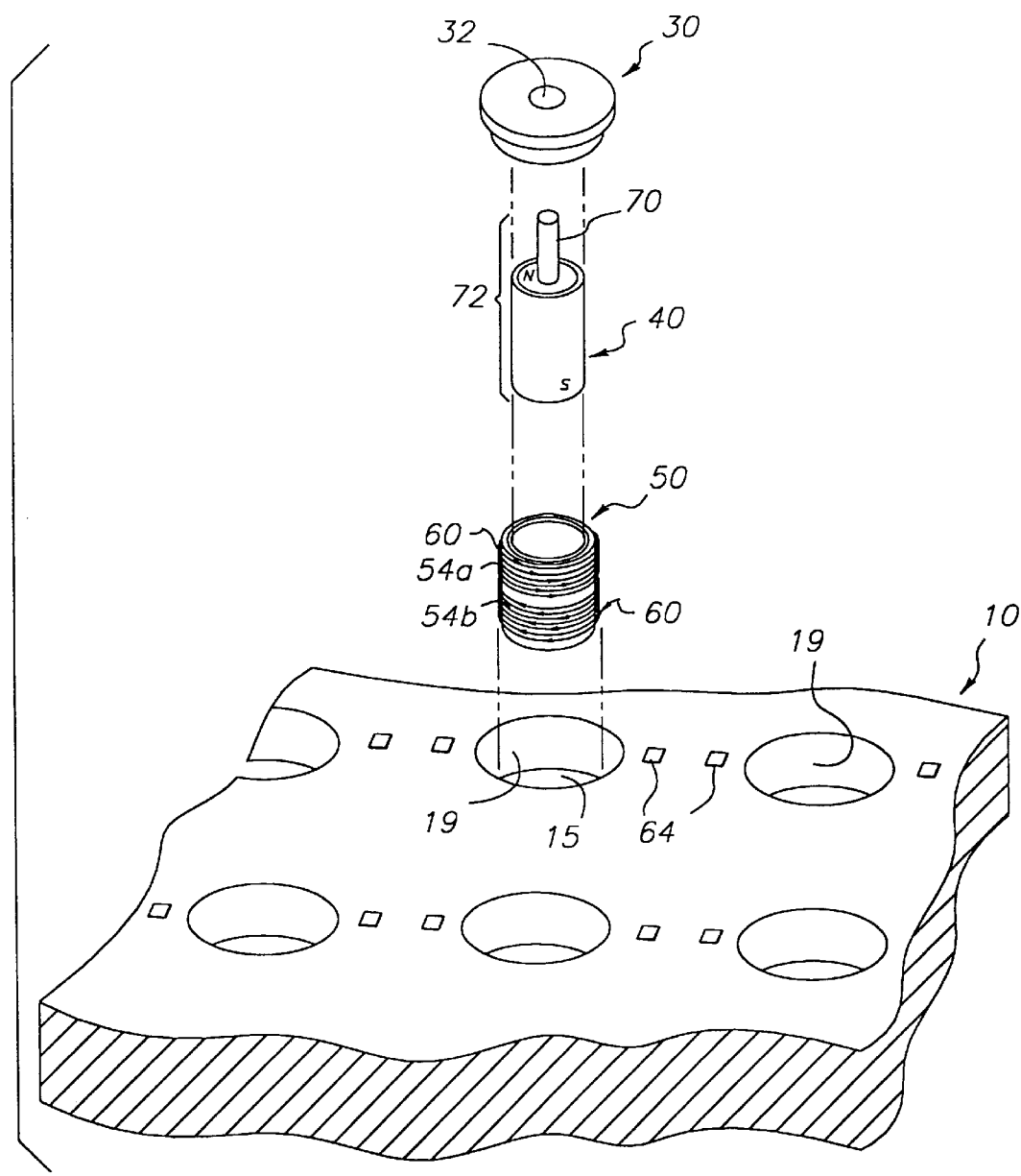

Turning now to the drawings, and particularly to FIGS. 1 and 6, the integrated hybrid silicon-based micro-actuator 100 of the invention illustrates the incorporation of micro-molded monolithic ferromagnetic member or magnet 40 in an electrically insulating ceramic actuating chamber or cylinder 50. Shown in FIG. 2, actuator arm 70, preferably made of plastic although skilled artisans will appreciate that other similar materials may be used, is fixedly attached to ferromagnetic member 40 forming an actuating member 72. As perhaps best seen in FIGS. 1, 4, 5 & 6, actuating member 72 is then disposed for axial displacement inside actuating chamber 50.

According to FIGS. 1 and 5, in one embodiment of the invention, actuating chamber 50 has a first and second current carrying coil 54*a*, 54*b* wound around its circumference. In this embodiment, first current carrying coil 54*a* is wound clockwise around a top half portion of actuating chamber 50 and second current carrying coil 54*b* is wound counter-clockwise around a bottom half portion of actuating chamber 50. It should be appreciated that the winding direction of coils 54*a* and 54*b* are not important; but, it is within the contemplation of the invention that coils 54*a* and 54*b* are wound in opposite directions about the circumference of actuating chamber 50. Further, skilled artisans will appreciate that conventional winding technology equipped with tools to handle micro-components may be used to accomplish the windings.

Figure 3:
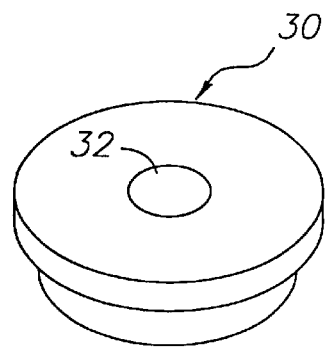

According to FIGS. 1 & 6, a micro-molded insulating ceramic end cap 30 (see FIG. 3 and description below) has a central opening 32 through which actuator arm 70 passes to confine the ferromagnet 40 within the ceramic actuating chamber 50. Actuator arm 70, preferably a cylindrical rod, made from engineering plastic such as nylon, polyimides, pvc and the like, having the dimension not exceeding 100 μm in diameter in cross section and a suitable length, is attached to one end of the ferromagnet 40 using any known conventional bonding technique. Thus, the preferably plastic actuating arm 70 is the primary actuating element for the micro-actuator 100. Those skilled in the art will appreciate that actuator arm 70 can be made from other engineering materials such as aluminum, magnesium, graphite reinforced epoxy composites, and other materials having attributes of good mechanical strength and light weight. It is important to the invention that the length of the ferromagnet 40 is shorter than the inside length of the ceramic actuating chamber 50 to insure ample space for axial displacement inside actuating chamber 50 when the actuating member 72 is energized, as described below.

Referring again to FIGS. 1 & 6, integrated hybrid silicon-based micro-actuator 100 of the invention further comprises a generally planar silicon wafer 10 having at least one substantially cylindrical hole or cavity 15. Preferably cavity 15 is etched into silicon wafer 10 using any conventional etching process such that the cavity 15 has a continuous vertical sidewall 19 surrounding the cavity 15. It is also important to the invention that cavity 15 has a diameter slightly larger than the outside diameter of the ceramic actuating chamber 50.

Referring to FIG. 1, micro-molded monolithic ferromagnet 40 inside ceramic actuating chamber 50 is disposed inside in a cavity 15 of silicon wafer 10. Preferably, any free space between the actuating chamber 50 and sidewall 19 of cavity 15 is filled with electrically insulating epoxy 20 to bond those components to the silicon wafer 10. If desired, the epoxy 20 can be conveniently replaced with ceramic or glass sol-gel or ceramic slurry and cured at a relatively higher temperature but not exceeding 300° C. Ceramic slurry or sol-gel will offer greater rigidity and higher strength for the devices. As seen in FIG. 5, active electrical leads 60 coming off from the wound coils 54*a*, 54*b* are soldered or bonded to conducting pads 64 which are generated on the silicon wafer 10 by conventional thin film technology. The micro-device thus fabricated can be used as an actuator or a solenoid which may be used as a component for an ink jet engine or related applications.

Skill artisans will appreciate that micro-molding technology is made possible by designing and fabricating molding tools using MEMS technology. Micro-molding ceramics with features as small as 100 μm has been fully described by the inventors in U.S. patent application Ser. No. 08/749,256, filed Nov. 15, 1996, entitled "Method For Micro-Molding Ceramic Structures", by Furlani et al. Similarly details of micro-molding magnets and electromechanical parts have been fully described by the inventors as set forth below.

Figure 2:
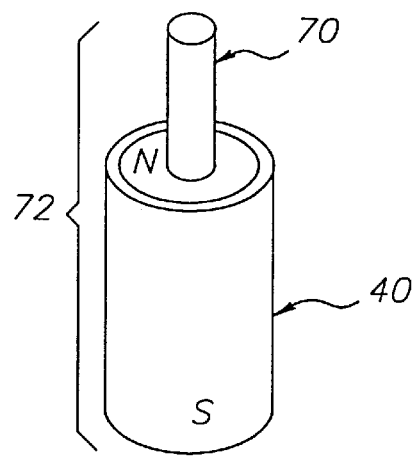

Referring to FIG. 2, micro-molded ferromagnet 40 is preferably generally cylindrical and made from hard magnetic materials, such as NdFeB, barium ferrite, and SmCo which can be produced using injection molding process. The details of the preferred method of forming micro-magnets are described in the commonly assigned U.S. patent application Ser. No. 08/866,991, filed Jun. 2, 1997, entitled "Method For Making Ceramic Micro-Electromechanical Parts and Tools", by Furlani et al, and commonly assigned U.S. patent application Ser. No. 08/795,960, filed Jan. 31, 1997, entitled "Method For Making Ceramic Tools For The Production Of Micro-Magnets", by Furlani et al, both hereby incorporated herein by reference Referring now to FIG. 3, micro-molded end cap 30 is preferably made from insulating ceramic materials. The details a preferred method of forming micro-molded ceramic components are described in the commonly assigned U.S. patent application Ser. No. 08/749,256, filed Nov. 15, 1996, entitled "Method For Micro-Molding Ceramic Structures", by Furlani et al, hereby incorporated herein by reference. The end cap 30 can be formed by dry pressing or injection molding insulating ceramic such as alumina, silica, magnesia and zirconia.

Figure 4:
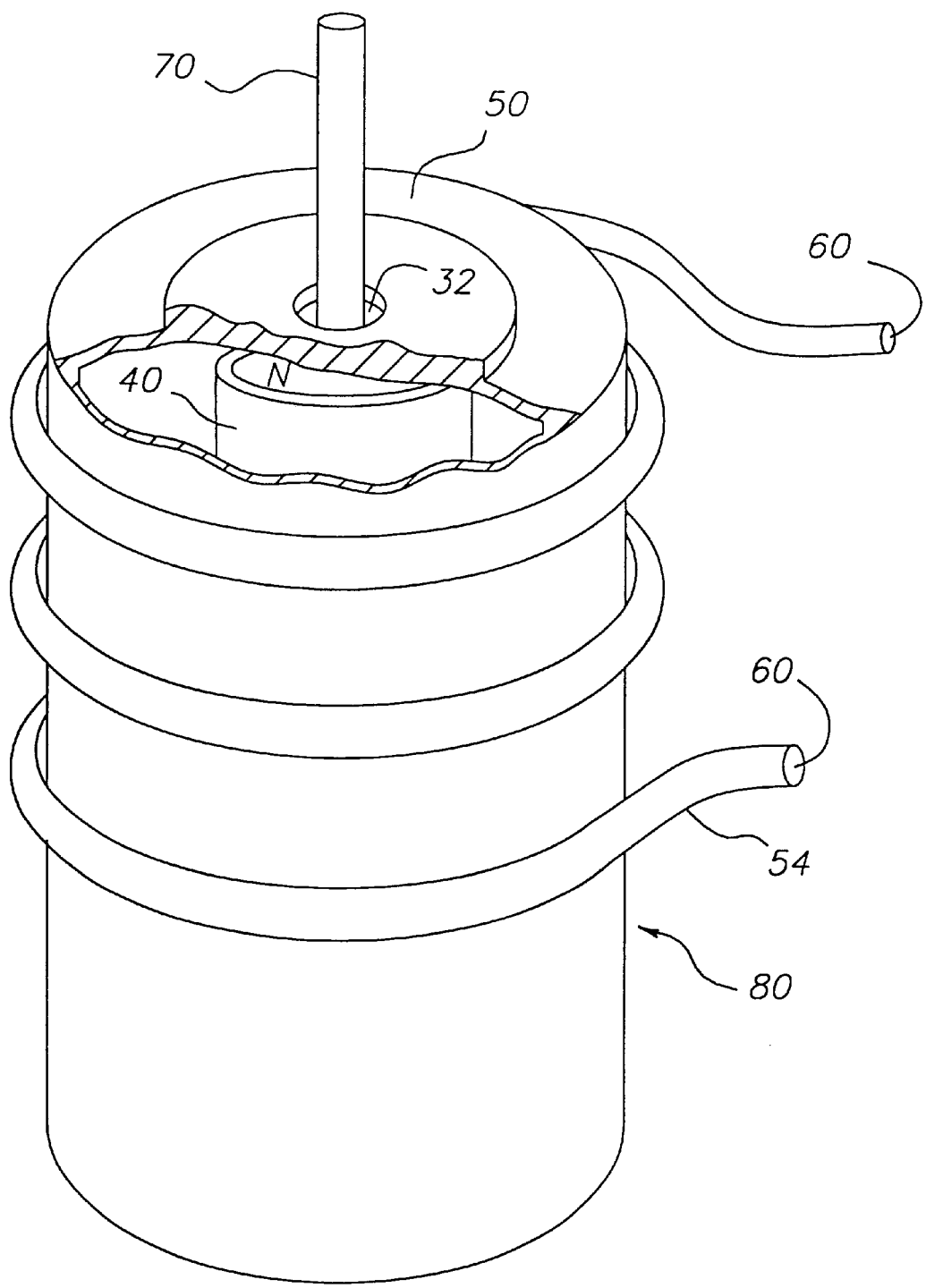

Referring to FIG. 4, an alternative embodiment, ferromagnet 40 is shown disposed in micro-molded ceramic actuating chamber 80. In this embodiment, actuating chamber 80 has a single electrical conductor 54 with free ends 60 wound about its outer circumference and only partially along its axial length. As shown, micro-molded magnet 40 disposed has actuator arm 70 protruding outward through opening 32 in closure member or end cap 30. Thus, magnet 40 coupled with the electrical coil 54 wound around its outer circumference having the insulating ceramic actuating chamber 50 therebetween forms an electromagnet when the coil is energized by a power supply (not shown).

Referring again to FIGS. 4 & 5, in operations, a source of power (not shown) causes current to flow through the coil 54 (single wind as illustrated in FIG. 4)) in a first direction that propels the actuator arm 70 upwardly inside actuating chamber 80. The motion of the actuator arm 70 in response to the current can be understood by considering the interaction of the magnetic field of the electromagnet with the magnetic poles of the magnet 40. Specifically, the coil 54 produces a magnetic field substantially along its axis that imparts an upward force in the north pole of the magnet 40 that moves upward inside the actuating chamber 80 as a consequence of these forces. According to FIG. 5, similar forces are operative in the alternative embodiment wherein the first and second current carrying coils 54a and 54b respectively, are used. Coils 54a, 54b wrapped about the circumference of actuating chamber 50 interacts with the north pole of the magnet 40 and axially displaces the magnet 40 along with the actuator arm 70 upward in the actuating chamber 50. In a similar fashion, the coils 54a, 54b produces a magnetic field substantially along its axis that again imparts an upward force to the south pole (not shown) of the magnet 40. The advantage of this alternative embodiment is that the combined interaction forces of the north and south poles deliver more energy to the actuator arm 70.

Referring to FIG. 6, depicted are the hybrid components integral to the invention integrated into a silicon wafer 10. An array of cylindrical cavities 15, described above, are etched on the generally planar surface of silicon wafer 10. Deposited onto silicon wafer 10 in close proximity to each cavity is a plurality of conducting electrical pads 64. Electrical pads 64 are formed on silicon wafer 10 using conventional thin film technology. The free ends 60 from coils 54a, 54b, are soldered onto the conducting pads 64 to build the integrated hybrid silicon-based micro-devices.

Thus, the invention has been described in detail with particular reference to certain preferred embodiments thereof, but it will be understood and appreciated that variations and modifications can be effected within the spirit and scope of the invention.

Parts List 10 silicon wafer
15 cylindrical hole or cavity
19 continuous vertical sidewall
20 epoxy or other insulating glass or ceramic
30 micro-molded insulating ceramic end cap
32 central opening of end cap 30
40 micro-molded monolithic ferromagnetic member or magnet
50 ceramic actuating chamber or cylinder
54 single electrical conductor or coil
54a first current carrying coil
54b second current carrying coil
60 electrical conductor leads or free ends
64 conducting pads
70 actuator arm
72 actuating member
80 micro-molded ceramic actuating chamber
100 integrated hybrid silicon-based micro-actuator

What is claimed is:

1. A method of making an integrated micro-actuator, comprising the steps of:

(a) providing a generally planar silicon wafer having at least one generally cylindrical, etched cavity therein and at least two electrical contacts arranged about said at least one cavity;

(b) providing a micro-molded ferromagnetic member having first and second ends and a non-magnetic actuator arm extending from any one of said first and second ends;

(c) providing an electrically insulated actuating chamber having an open end for receiving said ferromagnetic member for axial reciprocating displacement therein, said actuating chamber having a first electrical coil wound clockwise about a first half portion of said actuating chamber and a second electrical coil wound counterclockwise about a second half portion of said chamber, each of said first and second coils having a pair of electrically active free end portions;

(d) arranging said ferromagnetic member for axial displacement inside said actuating chamber with said actuator arm protruding outwardly from said actuating chamber thereby forming an electromagnetic actuator assemblage;

(e) securely applying a closure member to said open end of said actuating chamber containing said ferromagnetic member such that said actuator arm protrudes through said closure member;

(f) arranging said electromagnetic actuator assemblage securely into said at least one cavity in said silicon wafer such that said pair of electrically active free end portions of said first and second coils surrounding said actuating chamber when contacted to corresponding electrical contacts arranged about said at least one cavity in said silicon wafer provides an electrically conductive path and wherein current flow through said electrically conductive path causes said ferromagnetic member to move axially inside said actuating chamber in response to said current flow thereby defining a micro-actuator; and g) bonding the electromagnetic actuator assembly in the cavity with an electrically-insulating bonding agent that is cured at a temperature not greater than 300° C.

2. The method recited in claim 1 wherein the step of providing a micro-molded ferromagnetic member comprises the step of forming said ferromagnetic member from materials selected from the group consisting of: NdFeB, Ba-ferrite, SmCo, and a mixture thereof.

3. The method recited in claim 1 wherein the step of arranging said electromagnetic actuating assemblage further includes applying a negative voltage to one electrical contact and positive voltage to an opposite contact, said negative and positive voltages inducing a current through said first and second electrical coils thereby causing axial movement of said ferromagnetic member inside said actuating chamber, and wherein voltages of opposite polarity when applied to said contacts produces a downward axial movement of said electromagnetic actuating assemblage inside said actuating chamber.

4. The method recited in claim 1 wherein the step of providing an insulating actuating member comprises the step of forming said actuating member of materials selected from the group consisting of ceramics comprising alumina, silica, magnesia, zirconia and a mixture thereof.

5. A method of embedding a micro-actuator into silicon substrate, comprising the steps of:
   a) providing a silicon wafer for use as the silicon substrate;
   b) providing a micro-actuator having a micro-molded ferromagetic member in a ceramic actuating chamber surrounded by conductive coil;
   c) forming a cavity within the silicon substrate;
   d) placing the micro-actuator into the cavity in the silicon substrate;
   e) bonding the micro-actuator in the cavity with an electrically-insulating bonding agent that is cured at a temperature not greater than 300° C.

6. The method claimed in claim 5, wherein the micro-actuator includes an actuator arm attached to the micro-molded ferromagnetic member and passing through a central opening of the ceramic actuating chamber.

7. The method claimed in claim 6 wherein the step of providing a micro-molded cylindrical ferromagnetic member comprises the step of forming the ferromagnetic member from materials selected from the group consisting of: NdFeB, Ba-ferrite, SmCo, and a mixture thereof.

8. The method claimed in claim 5, wherein step (c) further comprises etching the silicon wafer to define the cavity.

9. An integrated hybrid silicon based micro-actuator, comprising:
   a micro-molded ferromagnetic member;
   an actuator arm connected to the ferromagnetic member;
   a ceramic actuating chamber enclosing the ferromagnetic member and allowing the actuator arm to extend from the chamber;
   a conductive coil surrounding the actuating chamber;
   a silicon wafer defining a cavity for receiving the ceramic actuating chamber;
   a non-conductive bonding agent that is cured at a temperature not greater than 300° C. for physically filling free spaces between the ceramic actuating chamber and a sidewall of the cavity within the silicon wafer; and
   a plurality of electrical conductive pads formed on the silicon wafer and connected to the conductive coil.

10. The apparatus claimed in claim 9, wherein the actuator arm is a cylindrical rod.

11. The apparatus claimed in claim 9, wherein the actuator arm has a diameter not exceeding 100 micro-meters.

12. The apparatus claimed in claim 9, wherein the non-conductive bonding agent is cured ceramic slurry.

13. The apparatus claimed in claim 9, wherein the non-conductive bonding agent is cured ceramic or glass sol-gel.

14. The apparatus claimed in claim 9, wherein the non-conductive bonding agent is cured epoxy.

15. The apparatus claimed in claim 9, wherein the sidewall of the silicon wafer cavity is a continuous vertical sidewall.

16. The apparatus claimed in claim 9, wherein the silicon wafer cavity has a diameter slightly larger than the outside diameter of the ceramic actuating chamber.

17. An array of hybrid micro-molded actuators, comprising:
   a silicon substrate defining an array of cylindrical cavities;
   a plurality of actuators each including a ceramic actuating chamber, a micro-molded ferromagnetic member located in the actuating chamber, and a conducting electrical coil surrounding the actuating chamber for carrying electrical current for displacing the micro-molded ferromagnetic member;
   a non-conductive bonding agent that is cured at a temperature not greater than 300° C.; and bonding the respective actuators in the respective cavities; and
   a plurality of conducting electrical pads on the surface of the substrate and electrically connected to the conducting electrical coils.

* * * * *